United States Patent
Moriya et al.

(10) Patent No.: US 6,994,748 B2
(45) Date of Patent: Feb. 7, 2006

(54) METHOD AND APPARATUS FOR MEASURING MELT LEVEL

(75) Inventors: Masato Moriya, Hiratsuka (JP); Tadayuki Hanamoto, Hiratsuka (JP); Hiroshi Monden, Hiratsuka (JP); Toshio Hayashida, Hiratsuka (JP); Toshirou Kotooka, Hiratsuka (JP)

(73) Assignee: Komatsu Denshi Kinzoku Kabushiki Kaisha, Kanagawa (JP)

( * ) Notice: Subject to any disclaimer, the term of this patent is extended or adjusted under 35 U.S.C. 154(b) by 294 days.

(21) Appl. No.: 10/258,984

(22) PCT Filed: May 1, 2001

(86) PCT No.: PCT/JP01/03761

§ 371 (c)(1),
(2), (4) Date: Oct. 30, 2002

(87) PCT Pub. No.: WO01/83859

PCT Pub. Date: Nov. 8, 2001

(65) Prior Publication Data

US 2003/0116729 A1    Jun. 26, 2003

(30) Foreign Application Priority Data

May 1, 2000    (JP)    ............................. 2000-132776

(51) Int. Cl.
*C30B 15/00* (2006.01)

(52) U.S. Cl. ............................. 117/14; 117/11; 117/13; 117/200; 117/201

(58) Field of Classification Search ................ 117/11, 117/13, 14, 15, 200, 201, 203, 206
See application file for complete search history.

(56) References Cited

U.S. PATENT DOCUMENTS

| | | | | | |
|---|---|---|---|---|---|
| 5,292,486 | A | * | 3/1994 | Drechsel | 117/15 |
| 5,419,277 | A | * | 5/1995 | Urano et al. | 117/201 |
| 5,437,242 | A | * | 8/1995 | Hofstetter et al. | 117/14 |
| 5,882,402 | A | * | 3/1999 | Fuerhoff | 117/201 |
| 6,071,340 | A | * | 6/2000 | Li | 117/201 |
| 6,572,699 | B1 | * | 6/2003 | Moriya et al. | 117/15 |

FOREIGN PATENT DOCUMENTS

| | | |
|---|---|---|
| EP | 0610830 A1 | 8/1994 |
| JP | 5-194079 | 8/1993 |
| JP | 5-194080 | 8/1993 |
| JP | 5-238877 | 9/1993 |
| JP | 5294785 | 11/1993 |
| JP | 6-316484 | 11/1994 |
| JP | 2000-264779 | 9/2000 |
| WO | WO 01/83859 | 11/2001 |

* cited by examiner

*Primary Examiner*—Robert Kunemund
*Assistant Examiner*—Matthew J. Song
(74) *Attorney, Agent, or Firm*—Welsh & Katz, Ltd.

(57) ABSTRACT

A melt level or the gap between a melt surface and a heat shield is measured accurately irrespective of how the melt surface is. A laser beam from a range-finding unit is reflected by a scanning mirror and projected on a melt surface through an entrance window and a quartz prism in a chamber of a puller. After specular reflection, the beam forms a measurement spot in the bottom of a heat shield and scatters. Part of the scatter, after specular reflection at the melt surface (secondary reflection), passes through the prism, the entrance window and the scanning mirror to the range-finding unit. The range-finding unit carries out triangulation using the distance between a laser source and a photodetector therein, and the angle of incidence and the angle of the received laser beam.

6 Claims, 11 Drawing Sheets

METHOD AND APPARATUS FOR MEASURING MELT LEVEL

TECHNICAL FIELD

The present invention relates to an apparatus and method for measuring a fluid level height (melt level) of a raw material melt in a Czochralski type single crystal puller, a height (member position level) of a prescribed in-furnace member such as a heat shield, and a distance between the melt level and the bottom of a prescribed in-furnace member (especially a distance between the melt level and the bottom of the heat shield).

BACKGROUND ART

[Necessity of Measuring a Melt Level]

The Czochralski method (CZ method) is to pull a single crystal ingot from the raw material melt such as silicon in a crucible, and it is necessary to accurately measure a fluid level (hereinafter referred to as the melt level) of the raw material melt and adjust it in order to grow a crystal finely.

The accurate measurement and adjustment of the melt level by the CZ type single crystal puller are useful to control a relative position of the heat shield and the melt level or a relative position of a heater and the melt level and to promote a stable growth of a crystal.

[Adjustment of a Relative Position of the Bottom of the Heat Shield and the Melt Level]

Generally, the existing CZ type silicon single crystal puller has a heat shield (or a heat shield) which controls heat radiation from a heater and a silicon melt and also rectifies gas being introduced into the furnace and can keep constant a thermal history and an impurity concentration (such as oxygen concentration) of the pulled silicon single crystal by controlling a relative position relationship between the bottom of the heat shield and the melt surface (namely, a distance between them; hereinafter referred to as the "melt surface-heat shield gap").

In this connection, it is essential to accurately adjust the melt surface-heat shield gap to stably produce a zero defect crystal (it is also called the "perfect crystal") which is free from grown-in defects such as void defects, dislocation clusters or the like, and it is necessary to precisely observe the melt surface-heat shield gap.

[Melt Level Measuring Apparatus]

As an existing technology of the melt level measuring apparatus, there is an apparatus as disclosed in Japanese Patent Examined Publication No. 3-17084. This existing apparatus measures a melt level based on the principle of triangulation, and it projects a laser beam in an enlarged form and receives it in order to level the measurement variations resulting from small ripples produced on the melt surface.

But, the melt surface has a factor, which inhibits the leveling of the melt surface, independent of the above-described small ripples, and it is an obstacle to the precise measurement of the melt level. It is a meniscus which is caused in the vicinity of the crystal because of the surface tension near the growing surface of the crystal, an inclination of the melt surface in a paraboloid shape formed on the entire melt surface resulting from the rotation of the crucible and the rotation of the pulled crystal, or a phenomenon that when the heat shield is close to the melt level, the melt surface in the vicinity of the lower part of the heat shield has a concave form because of an exhaust pressure of inert gas. In the CZ type single crystal puffer having the above-described heat shield, these are especially problems to measure a melt level of the melt surface which is seen through a small gap between the heat shield and the single crystal.

In order to solve such problems, the inventors have invented and filed a patent application for a melt level measuring apparatus and a melt level measuring method which reversely use the melt surface shape which is normally formed on the melt surface to scan in the radial direction of the crucible, find a position that the irradiated laser beam is accurately guided to a photodetector, and measure a melt level based on the principle of triangulation (Japanese Patent Application No. 11-071149).

And, according to the melt level measuring apparatus and melt level measuring method of Japanese Patent Application No. 11-071149, scanning by the laser beam is performed to a range covering both the melt surface and the heat shield, and the fluid level (melt level) of the melt surface and the heat shield height (position level) can be measured respectively. And, by calculating on the basis of the measured values, a distance between the bottom of the heat shield and the melt surface (melt surface-heat shield gap) can be determined.

However, when the periphery of a single crystal and the internal circumference of the heat shield surrounding it are very close to each other and an influence of the meniscus near the crystal in the pertinent point becomes large or when the unevenness of the melt surface is lost by the application of a magnetic field to the raw material melt (silicon melt), there are problems that a position where the reflected laser beam is guided to the photodetector cannot be found even by scanning in the radial direction of the crucible, and it is difficult to measure the melt level or the melt surface-heat shield gap.

DISCLOSURE OF THE INVENTION

The present invention was achieved in view of the above-described problems, and its object is to provide an apparatus and a method which can measure a melt level and a melt surface-heat shield gap more accurately than the conventional ones irrespective of the melt surface condition.

In order to solve the above problems, the present invention makes the melt level measuring apparatus, which is disclosed in Japanese Patent Application No. 11-071149, project the laser beam reflected from the melt surface onto the bottom of the heat shield and pickup the beam reflected from the bottom through the melt surface so to provide a more accurate melt level measuring apparatus, and at the same time, makes it possible to switch to a melt surface-heat shield gap measuring apparatus.

By the present invention, the CZ type single crystal puller is provided with a laser source and a photodetector at prescribed positions of a CZ furnace, the laser beam emitted from the laser source is projected onto the melt surface or the prescribed in-furnace member (e.g., the heat shield), the laser beam (primary reflection) directly reflected from the melt surface or the prescribed in-furnace member is received by the photodetector, the fluid level (melt level) of the melt surface in the CZ furnace is measured, and a height (member position level) of the prescribed in-furnace member (e.g., a heat shield) is detected based on the principle of triangulation in the same way as the melt level measuring apparatus disclosed in Japanese Patent Application No. 11-071149.

In addition, the level measuring apparatus according to the present invention can measure based on the principle of triangulation a fluid level (melt level) of the melt surface in the CZ furnace, measure a height of the bottom (bottom position level) of the prescribed in-furnace member (e.g., the heat shield) and also measure a distance between the melt surface and the bottom position level calculated from the measured value (it is a melt surface-heat shield gap when the prescribed in-furnace member is a heat shield) by projecting the laser beam reflected from the melt surface onto the bottom of the prescribed in-furnace member (e.g., the heat shield) and receiving the laser beam (secondary reflection), which is finally reflected from the melt surface through the order of "the melt surface→the bottom of the prescribed in-furnace member (e.g., the heat shield)→the melt surface", by the photodetector.

The distance between the melt level and the bottom position level (the melt surface-heat shield gap when the prescribed in-furnace member is the heat shield) may be measured considering the position of the bottom of the previously determined in-furnace member (e.g., the heat shield) when the measured value of the fluid level (melt level) or the height of the bottom (the bottom position level) of the prescribed in-furnace member (e.g., the heat shield) is obtained.

More specifically, the present invention provides the following melt level measuring apparatus and measuring method.

(1) A level measuring apparatus, comprising a mechanism having a laser source and a photodetector in prescribed positions of a CZ furnace, for projecting a laser beam emitted from the laser source onto a melt surface or a prescribed in-furnace member and receiving the laser beam (primary reflection) directly reflected from the melt surface or the prescribed in-furnace member by the photodetector; and a mechanism for projecting the laser beam reflected from the melt surface onto the bottom of the prescribed in-furnace member and receiving the laser beam (second reflection), which is finally reflected from the melt surface, by the photodetector through the sequence of "the melt surface→the bottom of the prescribed in-furnace member→the melt surface", the level measuring apparatus being capable of measuring a melt level of the melt surface in the CZ furnace based on the principle of triangulation, measuring a height of the prescribed in-furnace member, and measuring a distance between the melt surface and the bottom of the prescribed in-furnace member.

The "measurement of a distance between the melt surface and the bottom of the prescribed in-furnace member" may be calculated considering a position of the prescribed in-furnace member previously determined at the time of configuring the CZ furnace. At that time, in addition to the height of the prescribed in-furnace member, a shape, a size and a positional relationship are considered comprehensively.

The "prescribed in-furnace member" is represented by a heat shield but may be any member such as a cooler, a heater or the like disposed in the CZ furnace as long as the laser beam reflected from the melt surface can be scattered.

(2) The level measuring apparatus according to the above (1), wherein the melt level of the melt surface is measured by moving a projection position by the laser source in a radial direction of a crucible in the CZ furnace, scanning the projection position at which the laser beam reflected from the melt surface is received by the photodetector, and setting the projection position of the laser beam at the pertinent position.

(3) The level measuring apparatus according to the above (1), further comprising one or both of first light path changing means, which changes a path of the laser beam emitted from the laser source to project onto the melt surface, and second light path changing means, which changes the path of the laser beam reflected from the melt surface or the prescribed in-furnace member to guide to the photodetector.

(4) The level measuring apparatus according to the above (3), wherein a change of the projection position by the laser source is performed by the first and second light path changing means.

(5) The level measuring apparatus according to the above (3) or (4), further comprising an angle adjusting mechanism which adjusts a projection angle of the laser source.

(6) The level measuring apparatus according to any of the above (1) to (5), wherein the prescribed in-furnace member is a heat shield disposed within the CZ furnace.

(7) The level measuring apparatus according to any of the above (1) to (6), wherein the photodetector is provided with a two dimensional photosensor which detects two dimensional positions at the same time.

(8) A CZ type single crystal puller, comprising a mechanism having a laser source and a photodetector in prescribed positions of a CZ furnace, which projects a laser beam emitted from the laser source onto a melt surface or a prescribed in-furnace member and receives the laser beam (primary reflection), which is directly reflected from the melt surface or the prescribed in-furnace member, by the photodetector, and a mechanism which projects the laser beam reflected from the melt surface onto the bottom of the prescribed in-furnace member to receive the laser beam (second reflection), which is finally reflected from the melt surface, by the photodetector through the sequence of "the melt surface→the bottom of the prescribed in-furnace member→the melt surface".

The present invention can also be considered as the following method.

(9) In a CZ type single crystal puller provided with a melt level measuring apparatus having a laser source for projecting a laser beam onto a melt surface and a photodetector for receiving the laser beam reflected from the melt surface that are placed in prescribed positions of a CZ furnace, which measures a melt level of the melt surface in the CZ furnace based on the principle of triangulation, a method for improving a probability of receiving a laser beam in the photodetector by reflecting the laser beam reflected from the melt surface on the bottom of a heat shield and guiding the laser beam to the photodetector through a prescribed route.

(10) In a melt level measuring apparatus provided with a laser source and a photodetector in prescribed positions of a CZ furnace, which projects the laser beam emitted from the laser source onto a melt surface, receives the laser beam reflected from the projected spot by the photodetector, and measures a melt level of the melt surface in the CZ furnace based on the principle of triangulation, a method for making to project the laser beam reflected from the melt surface onto the bottom of a heat shield and making to receive the beam reflected from the bottom through the melt surface, thereby providing a more appropriate melt level measuring apparatus or switching to a melt surface-heat shield gap measuring apparatus.

In realizing the above-described apparatus and method, it is preferable to use the following reflector.

(11) A reflector for a level measuring apparatus, comprising a mirror plate which reflects a laser beam and allows heat rays to pass through and a heat rays absorbing plate which is disposed on the back side of the mirror plate, the mirror plate and the heat rays absorbing plate being paired in a mutually slidable state.

(12) A reflector for a level measuring apparatus, comprising a first mirror plate which reflects a laser beam and allows heat rays to pass through and a second mirror plate which is disposed on the back side of the first mirror plate and allows visible light to partly pass through, the first mirror plate and the second mirror plate being paired in a mutually slidable state.

The "paired in a mutually slidable state" can be configured by, for example, forming the pair with balls held between the two plates.

[Principles and Effects of the Invention]

As shown in FIG. 1 and FIG. 3, according to the present invention, a laser beam of a range-finding unit 8 based on the principle of triangulation is specular reflected from a melt surface 3 to form a measurement spot 31 on the back of the lower end of a heat shield 16, the image of the measurement spot is specular reflected again from the melt surface 3 and received by the range-finding unit 8. When the melt surface 3 is in a state with a magnetic field applied, it has a substantially flat state, convention of the silicon melt is suppressed, and fine vibration of the melt surface is substantially eliminated, so that the melt surface 3 can be used as a mirror having a flat surface.

As shown in FIG. 3, it is interpreted that the measurement spot 31 performs measurement which is equivalent to a case that an image is formed on a spot 31' on a virtual image 16' of the heat shield 16 with the melt surface 3 determined as a symmetry plane, so that the range-finding unit 8 measures a distance 21 to the melt surface 3 and a distance 21' from the melt surface 3 to the back of the lower end of the heat shield 16 in addition to the distance to the back of the lower end of the heat shield 16.

Here, the distances 21, 21' similarly denote a melt surface-heat shield gap (a distance between the melt surface and the bottom position level of the heat shield 16), so that it comes to measuring a distance two times larger than the melt surface-heat shield gap from the back of the lower end of the heat shield 16. A distance to a top face 25 of the lower end of the heat shield 16 is measured by the range-finding unit 8, and a thickness 26 of the lower end of the heat shield 16 is added to the measured distance to determine a distance (Ds) to the back (bottom) of the lower end of the heat shield 16. And a value obtained by subtracting the distance of the back (bottom) of the lower end of the heat shield 16 from the measured value obtained by making specular turnback on the melt surface 3 (a distance of two times of the melt surface-heat shield gap from the back of the lower end of the heat shield 16: Dw) is divided by 2 to determine a melt surface-heat shield gap (the following equation (1)).

$$\text{Melt surface–Heat shield gap} = (Dw - Ds)/2 \qquad (1)$$

It may be assumed that the distance to the back (bottom) of the lower end of the heat shield 16 is already known and used. Here, for example, when the heat shield 16 does not have an edge on the lower end as shown in FIG. 4, the method of determining Ds by measuring a distance to the top face 25 of the lower end of the heat shield 16 may have a large error, so that a previously determined value Ds may be used to calculate the melt surface-heat shield gap by the equation (1). According to the above measuring methods, the measurement spot 31 on the back of the lower end of the heat shield 16 is reflected as scattered beams of light, so that all reflected beams of light are not rejected by a gate valve 22 which is a component of the chamber 17 of the puller, and measurement can always be made stably.

As shown in FIG. 5 and FIG. 6, the present invention scans the measurement spot by turning or parallel movement of the range-finding unit 8 and a scanning mirror 24. When the measurement spot is scanned by turning or parallel movement of the range-finding unit 8 and the scanning mirror 24, each measurement may be made by identifying the edge of the lower end of the heat shield 16 from the measured value and scanned position, moving the measurement position by a travel distance previously determined from the identified position used as the reference position, making specular turnback on the top face of the lower end of the heat shield 16 or the melt surface 3, and irradiating the measurement spot 31 to an appropriate position of the back of the lower end of the heat shield 16 (the bottom of the heat shield 16). Thus, horizontal displacement involved in disassembling and reinstallation of the heat shield 16 can be compensated, the measurement spot 31 can be irradiated to an appropriate position, and the melt surface-heat shield gap can be measured stably.

BRIEF DESCRIPTION OF THE DRAWINGS

FIG. 11(A) and FIG. 11(C) are diagrams showing cross sections taken along line A—A of FIG. 11(B).

BEST MODE FOR CARRYING OUT THE INVENTION

Figure 1:
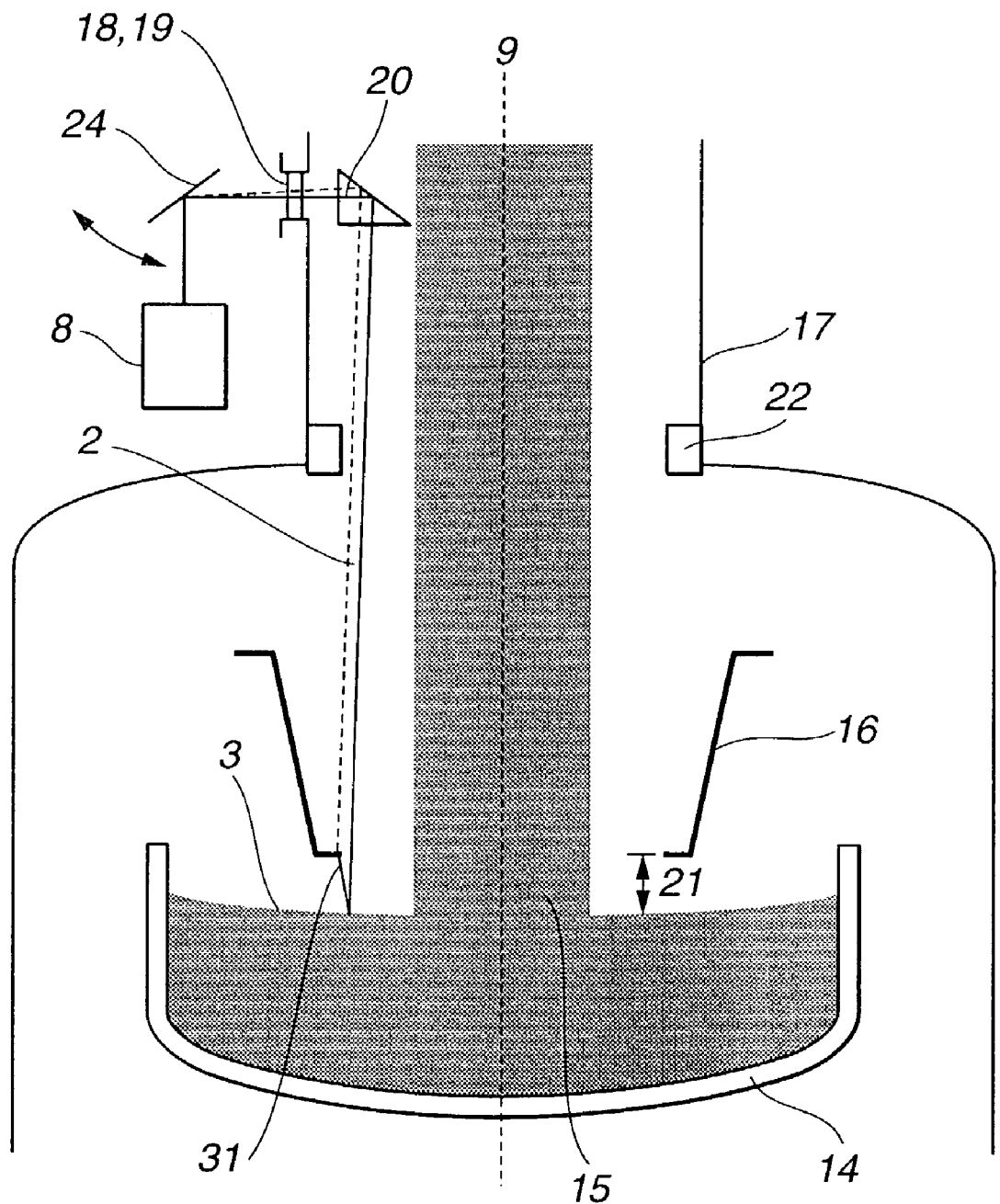
FIG. 1 is a block diagram showing the structure of a first embodiment of the invention.
Figure 3:
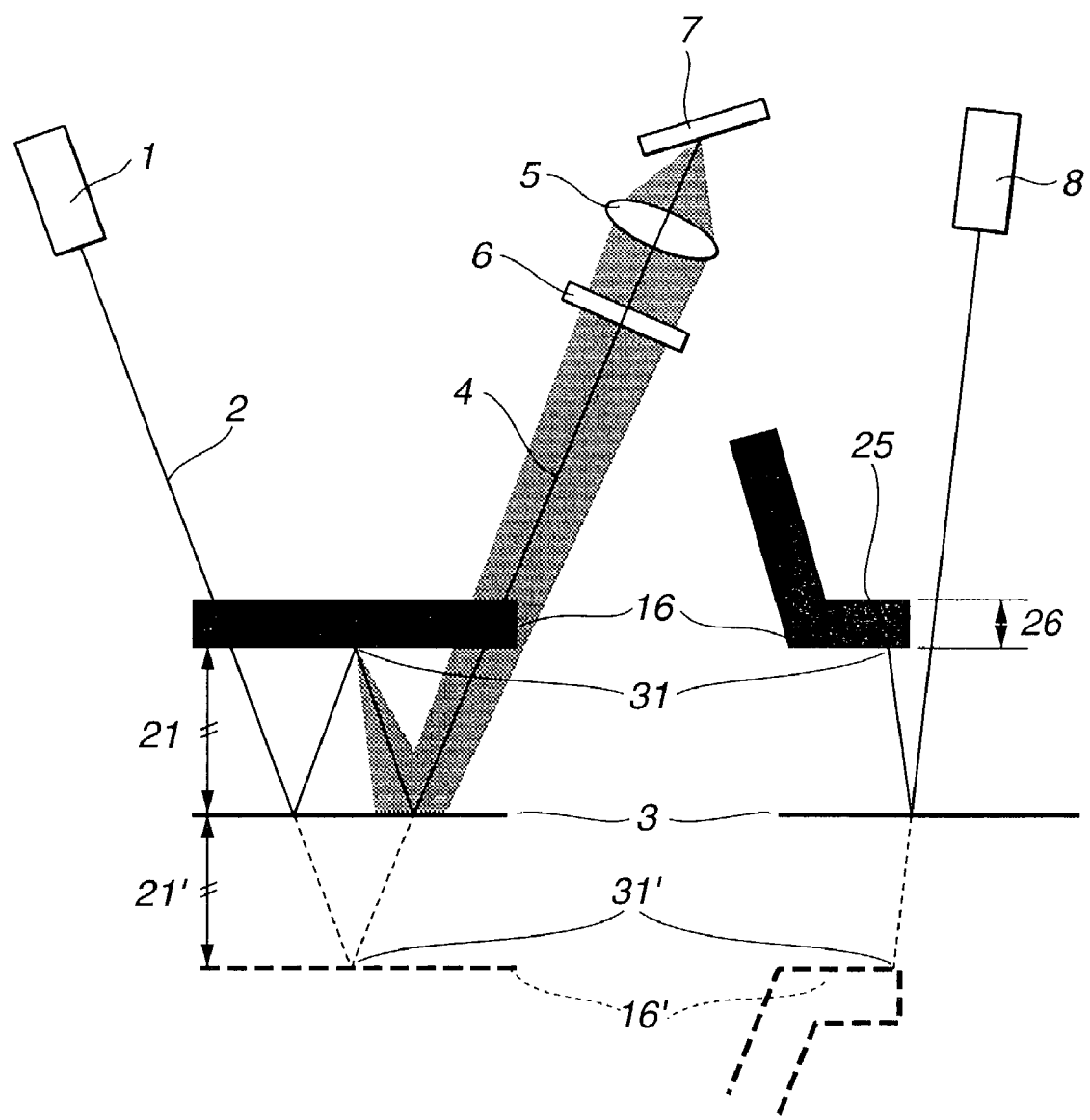
FIG. 3 is a conceptual diagram illustrating the first embodiment of the invention.

FIG. 1 and FIG. 3 are block diagrams showing a first embodiment of the present invention. A CZ type single crystal puller according to the first embodiment adopts a range-finding unit 8 based on the principle of triangulation, and the range-finding unit 8 is provided with a laser source which projects a laser beam onto a melt fluid surface 3 (melt surface 3) and a photodetector which receives the laser beam reflected by the melt fluid surface 3 (melt surface 3).

And, the laser beam 2 output from the range-finding unit 8 is reflected by a scanning mirror 24 and projected onto the melt surface 3 through an entrance window 18 and a quartz prism 20 which is placed within a chamber 17 of the puller. The laser beam 2 projected onto the melt surface 3 is specular reflected here, and a measurement spot 31 strikes the back (bottom) of the lower end of a heat shield 16. And, the laser beam 2 irradiated as the measurement spot 31 to the bottom of the heat shield 16 scatters here, its reflected and scattered beams of light are partly specular reflected (secondary reflection) on the melt surface 3 to enter the range-finding unit 8 through the prism 20, the entrance window 18 and the scanning mirror 24. The range-finding unit 8 based on the principle of triangulation calculates a distance (Dw) from a distance between the laser source and the photodetector built in it, an irradiation angle and an acceptance angle of the laser beam.

Then, the scanning mirror 24 is turned or moved to move the measurement spot 31 to the top face 25 of the lower end of the heat shield 16 so to make the reflected light (primary reflection) therefrom received by the range-finding unit 8 through the prism 20, the entrance window 18 and the scanning mirror 24 (the route indicated by a broken line in the drawing). And, by the same method as that used to calculate the Dw, a distance to the top face of the lower end of the heat shield 16 is calculated, and thickness 26 of the lower end of the heat shield 16 is added to determine a distance (Ds) to the back (bottom) of the lower end of the heat shield 16.

A distance (melt surface-heat shield gap) 21 between the melt surface and the bottom position level of the heat shield 16 is calculated by the following equation (1).

$$\text{Melt surface-heat shield gap} = (Dw - Ds)/2 \quad (1)$$

According to the present invention, the measurement spot 31 is formed on the bottom of the heat shield 16, but the laser beam 2 scatters on the bottom of the heat shield 16. The present invention has an advantage that it is resistant to shimmering because it is enough if any portion of the scattered laser beam can be picked up.

A pulling-up operator must observe the state in the puller chamber 17 through the entrance window 18 depending on the pulling-up process. To satisfy this requirement, the scanning mirror 24 may be assumed to be a dichroic mirror which is tuned for a wavelength of the laser used for the range-finding unit 8. Thus, the state inside the entrance window 18 can be observed through the scanning mirror 24. It is desired that the scanning mirror 24 is configured of a material having a less coefficient of thermal expansion, e.g., a substrate of quarts or ZERODUR®, to prevent the scanning mirror 24 from being heated and thermally deformed by intense radiant light from the melt surface and measurement accuracy from being degraded.

Figure 2:
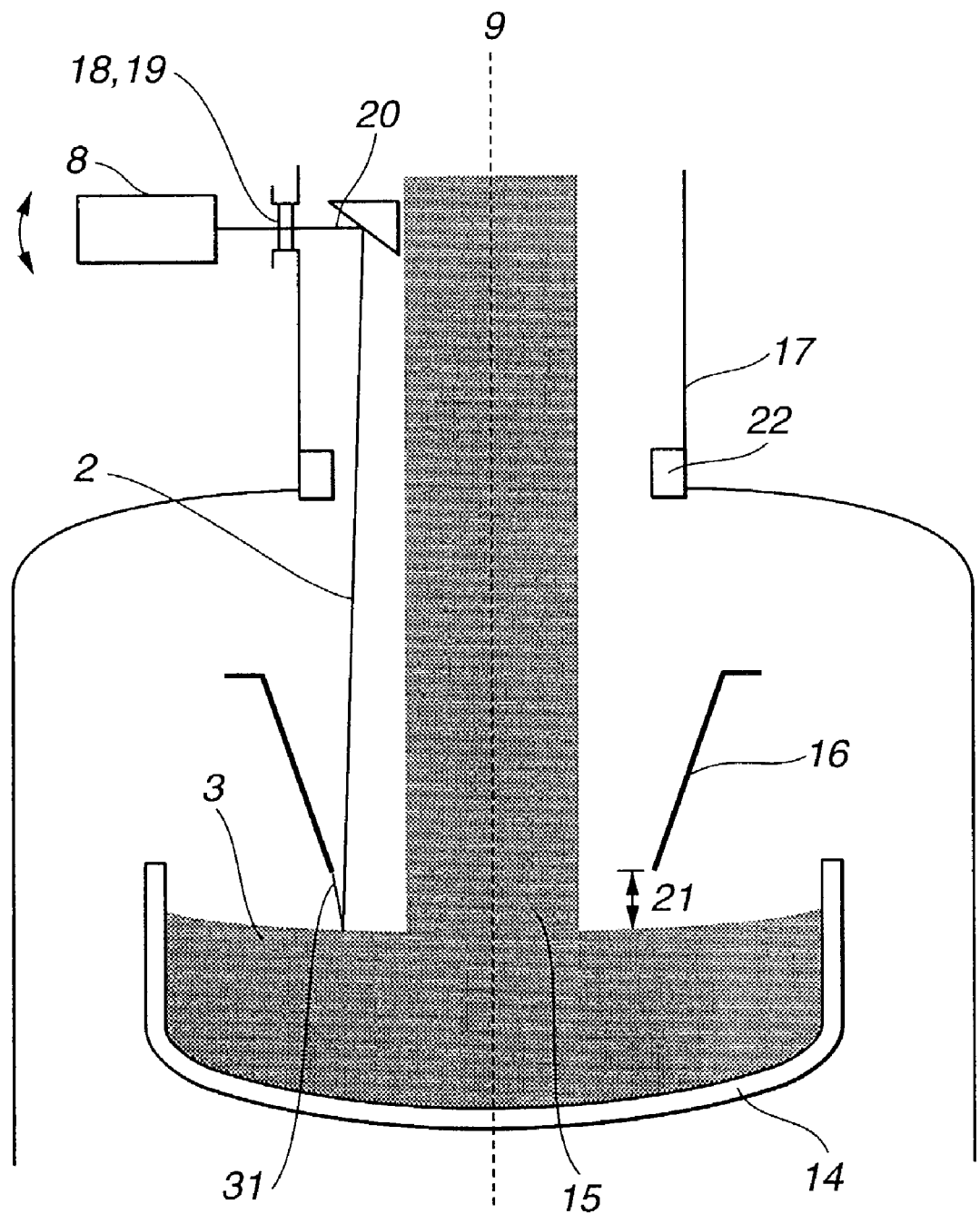
FIG. 2 is a block diagram showing the structure of a second embodiment of the invention.
Figure 4:
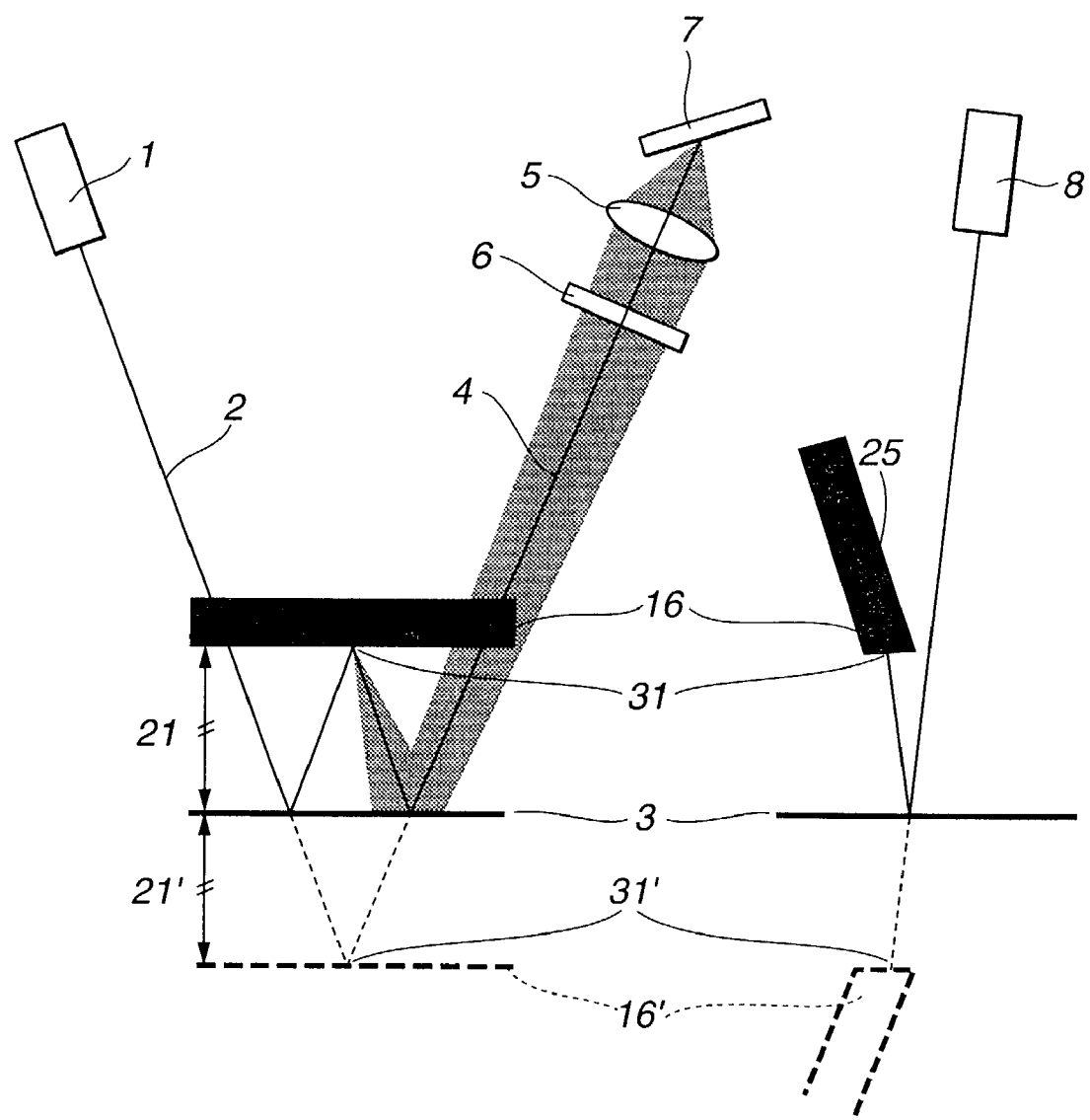
FIG. 4 is a conceptual diagram illustrating the second embodiment of the invention.

FIG. 2 and FIG. 4 are block diagrams showing a second embodiment of the present invention. The second embodiment is an embodiment with the heat shield 16 not having an edge on the lower end (FIG. 4), and as shown in FIG. 2, according to the CZ type single crystal puller according to the second embodiment of the present invention, the laser beam 2 is output from the range-finding unit 8, passed through the entrance window 18, reflected by the silicon mirror 20 which is disposed in the chamber 17 of the puller and projected onto the melt surface 3. And, after specular reflection here, the laser beam 2 is projected as the measurement spot 31 onto the back (bottom) of the lower end of the heat shield 16. The reflection (scattered light) of the measurement spot is specular reflected on the melt surface 3, and received by the range-finding unit 8 through the mirror 20 and the entrance window 18 to measure the distance (Dw).

According to the second embodiment, the range-finding unit 8 itself can be turned or moved to move the measurement spot 31 to an appropriate measurement position. As described above, the second embodiment is an embodiment in that the heat shield 16 does not have an edge on the lower end, a distance (Ds) to the back of the lower end of the heat shield 16 is not determined by measuring a distance to the top face of the lower end of the heat shield 16, but a previously measured or calculated Ds value is used to calculate the melt surface-heat shield gap 21 by the equation (1).

Figure 5:
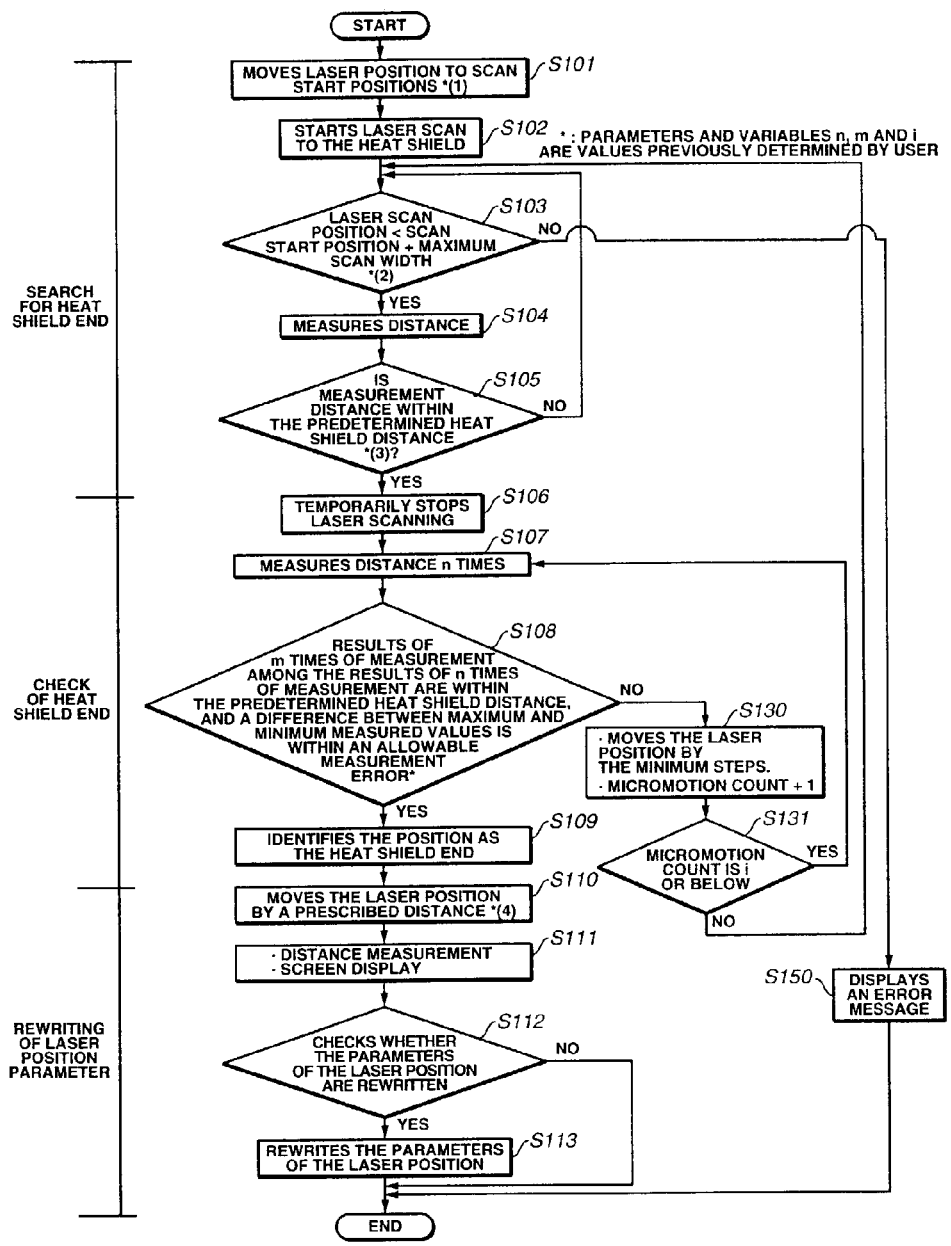
FIG. 5 is a diagram showing a process algorithm for irradiation of a measurement spot to an appropriate position on the back of the lower end of a heat shield or the top face of the heat shield.
Figure 5:
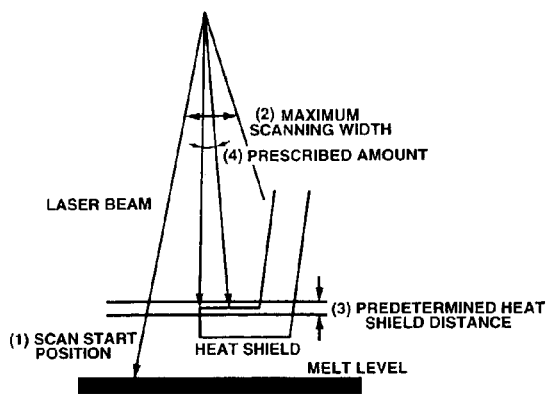
Figure 6:
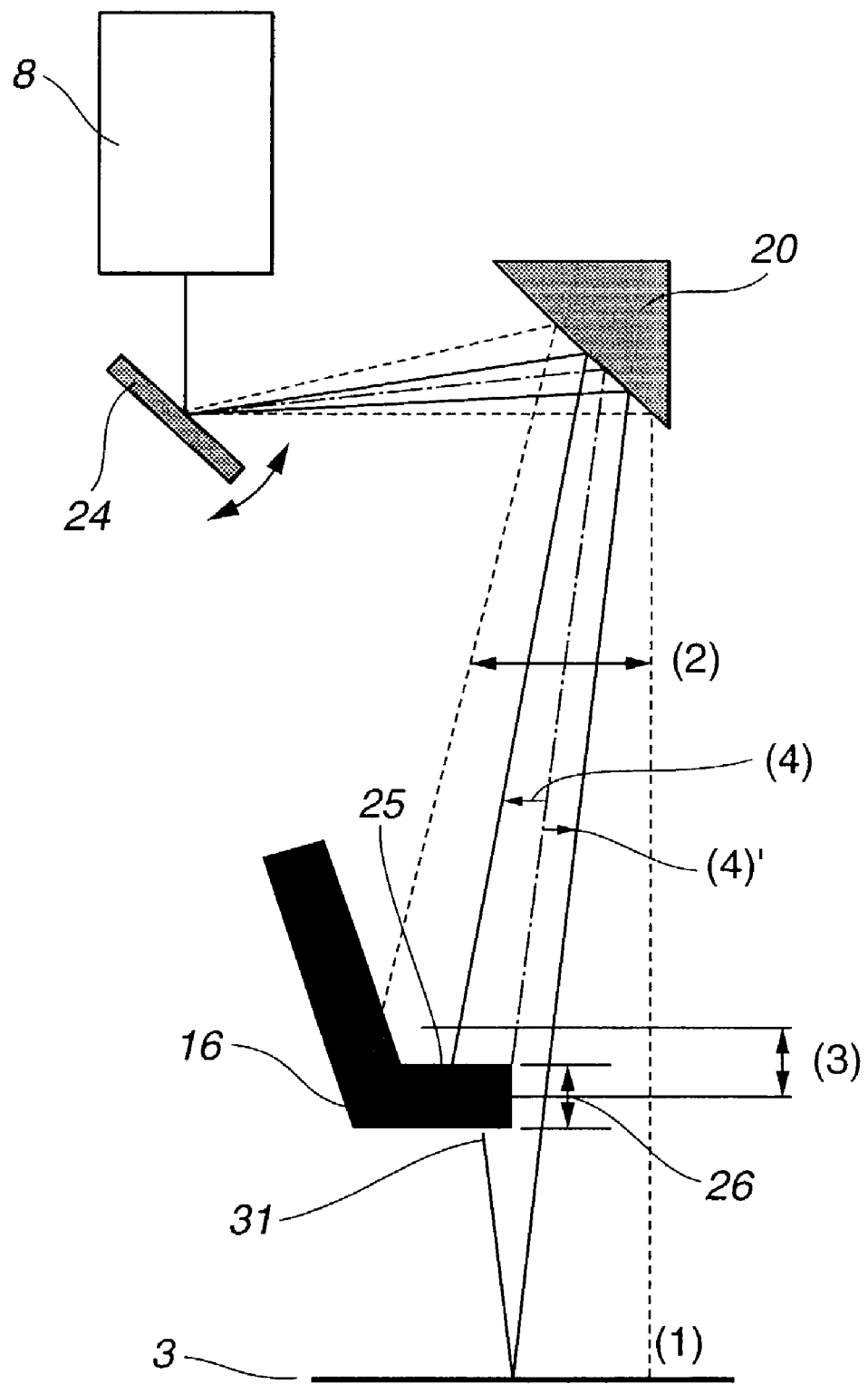
FIG. 6 is a diagram showing an embodiment having a scanning mirror rotated.

FIG. 5 shows a process algorithm by which the edge of the lower end of the heat shield 16 is searched and determined as a reference position, the measurement position is moved from the reference position by a previously determined travel distance only, and specular turnback is made on the top face of the lower end of the heat shield 16 or the melt surface 3 to irradiate the measurement spot 31 to an appropriate position on the back of the lower end of the heat shield 16. FIG. 6 shows that the above procedure is performed with the scanning mirror 24 turned, and FIG. 7 shows that the same procedure is performed with the scanning mirror 24 moved in parallel.

Figure 7:
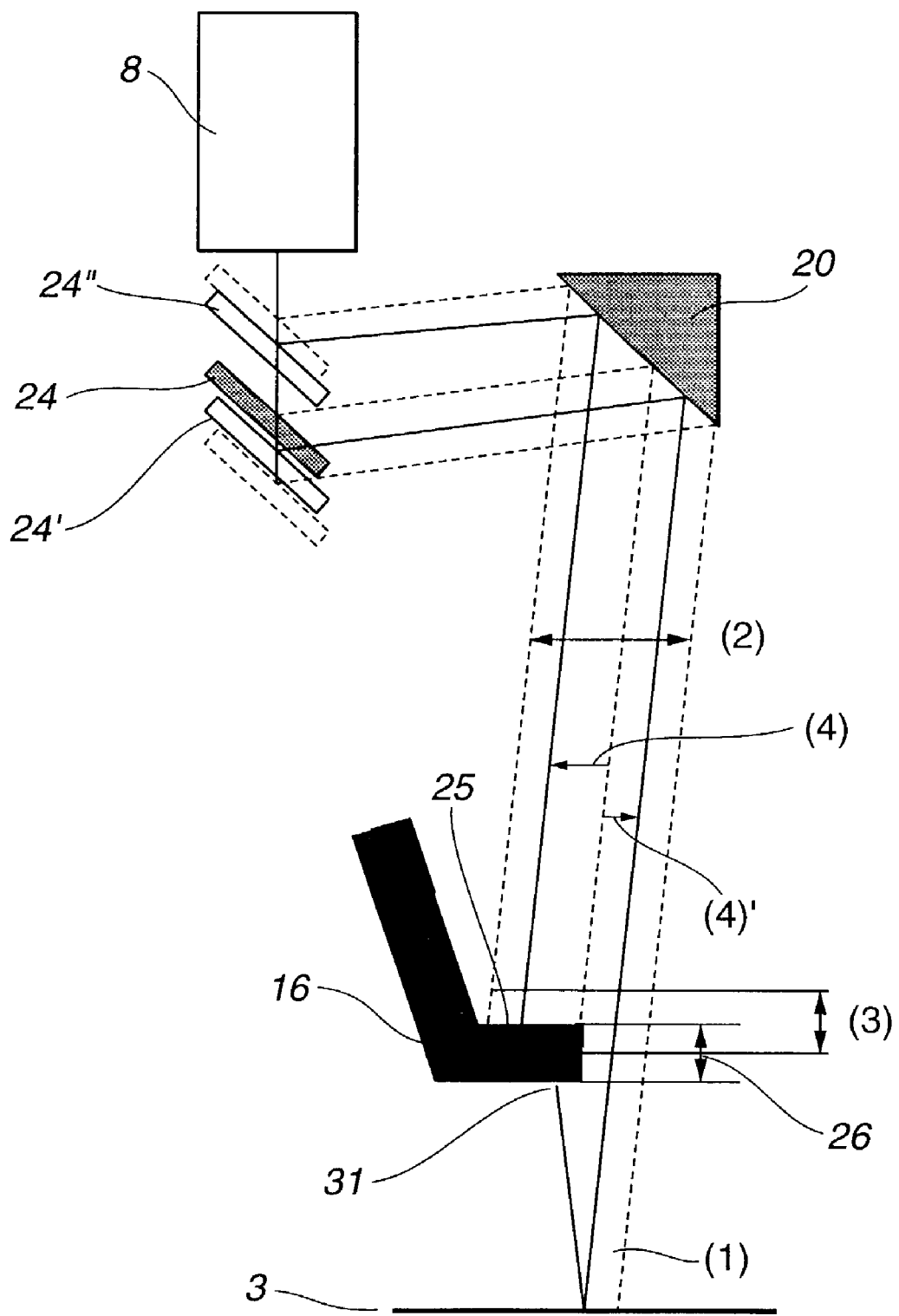
FIG. 7 is a diagram showing an embodiment having the scanning mirror moved in parallel.

In the embodiments shown in FIG. 6 and FIG. 7, the scanning mirror 24 is turned or moved in parallel, but the range-finding unit 8 itself may be turned or moved instead of the scanning mirror 24. The scanning mirror 24 and the range-finding unit 8 are not turned or moved independently, but they may employ a combination of turning and movement to make a search.

Referring to FIG. 5, this apparatus moves the laser to a prescribed scan initiation position to start scanning (S101, S102). And, scanning is performed with a predetermined maximum width (S103), and an "error message" is displayed if there is no response from the interior of the chamber 17 (S150), but when there is a response, a distance is measured (S104), and it is checked whether the measured distance is within the distance previously determined on the heat shield 16 (S105).

Here, when the distance measured in S104 is not within the predetermined distance on the heat shield 16, the procedure returns to S103, scanning is performed again to the maximum width, and a search for the heat shield edge is repeated until entry into the predetermined distance. But, when the distance measured in S104 is within the distance predetermined in connection with the heat shield 16, it is assumed that the heat shield edge was searched, and the procedure proceeds to a stage to check the heat shield edge. More specifically, when the distance measured in S104 is within the predetermined distance of the heat shield 16, the laser scanning is temporarily stopped (S106), and n times of distance measurement are made (S107). And, when the results of m times of measurement among the results of the n times of measurement are within the predetermined distance and when a difference between the maximum and minimum measured values is within an allowable measurement error range (S108), the pertinent position is recognized as the end of the heat shield 16 (S109).

Meanwhile, when at least one of a condition in that the results of m times of measurement among the results of the n times of measurement are within the predetermined distance and a condition in that a difference between the maximum and minimum measured values is within an allowable measurement error range is not met (S109), the laser projection position is moved by a minimum step (micromotion count+1) (S130), n times of distance measurement are made on the spot (S107), and n times of distance measurement are made (S130→S131→S107→S108→S130) with minimum step movement (micromotion count+1) made until both the two conditions determined in the above S109 are met.

However, if both the two conditions determined in the above S109 are not satisfied even when the n times of distance measurement with the minimum step movement (micromotion count+1) (S130→S131→S107→S108→S130) are made for i times, the procedure returns to S103, and the scanning with the maximum width is performed again. The parameters n, m and i used as criteria for judgment in the stage to check the heat shield end shall be previously determined by a user comprehensively considering the embodiments, target accuracy and other conditions.

After the heat shield end is identified, the parameters of the laser position are rewritten. The procedure will be described more specifically. After the heat shield end is identified (S109), the laser position is moved by a predetermined distance to make the laser reflected from the melt surface hit the measurement spot 31 on the back of the heat shield so to measure the distance to the spot and display it on the screen (S111), and if it is necessary to rewrite the parameters of the laser position, it is done (S112, S113).

Similarly, to set for the measurement of the heat shield, after the heat shield end is recognized (S109), the laser position is moved by a predetermined distance to have the measurement spot 31 in appropriate positions on the top face of the lower end of the heat shield 16, e.g., in the vicinity of the center, the distances to the spots are measured and measurements of the spots are displayed on the screen (S111), and if it is necessary to rewrite the parameters of the laser position, it is performed (S112, S113).

This algorithm is controlled and processed by a measuring instrument controller 29 shown in FIG. 8 to be described later. A search may be performed one time after the heat shield 16 is disassembled or reinstalled or when it is newly installed, or it may be performed periodically during the pull-up process. When a horizontal position of the edge of the lower end of the heat shield 16 identified by the search exceeds a normal range, the operator may be alerted.

Figure 8:
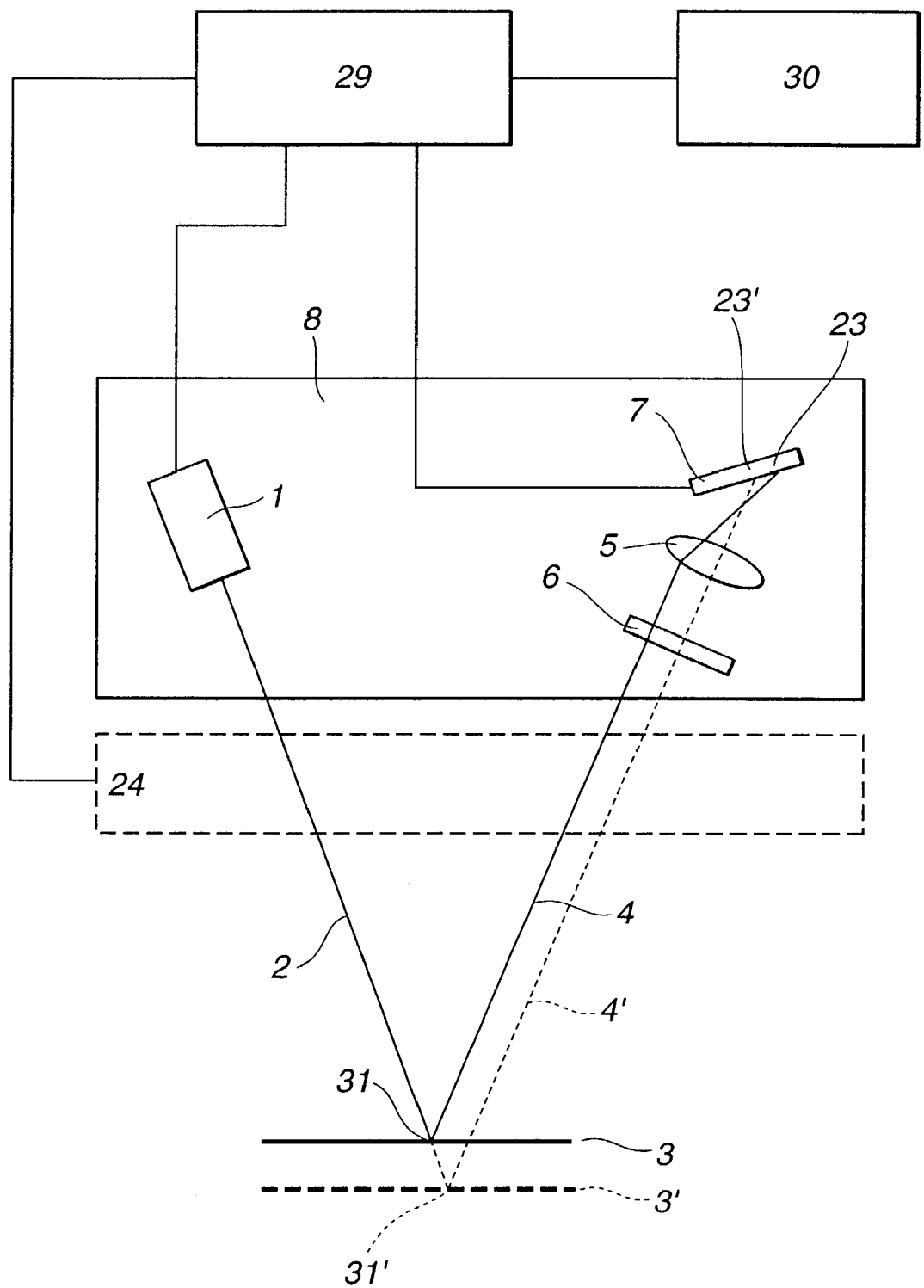
FIG. 8 is a block diagram illustrating the structure of a range-finding unit 8 and a measurement method based on the principle of triangulation.

FIG. 8 is a block diagram illustrating the structure of the measurement unit 8 and a measurement method based on the principle of triangulation. The laser beam 2 output from the laser source 1 projects the measurement spot 31 onto a measured surface such as the melt surface 3, and reflection 4 from the melt surface 3 forms an image in an imaging spot 23 on a line CCD sensor 7 through an optical filter 6 and an imaging lens 5. Here, when a distance to the measured surface of the melt surface 3 or the like changes to a distance to a measured surface 3', the measurement spot 31 moves to 31', and the imaging spot 23 on the line CCD sensor 7 also moves to 23' accordingly. Thus, a distance of the measured surface from the position of the imaging spot on the line CCD sensor 7 can be determined.

Figure 9:
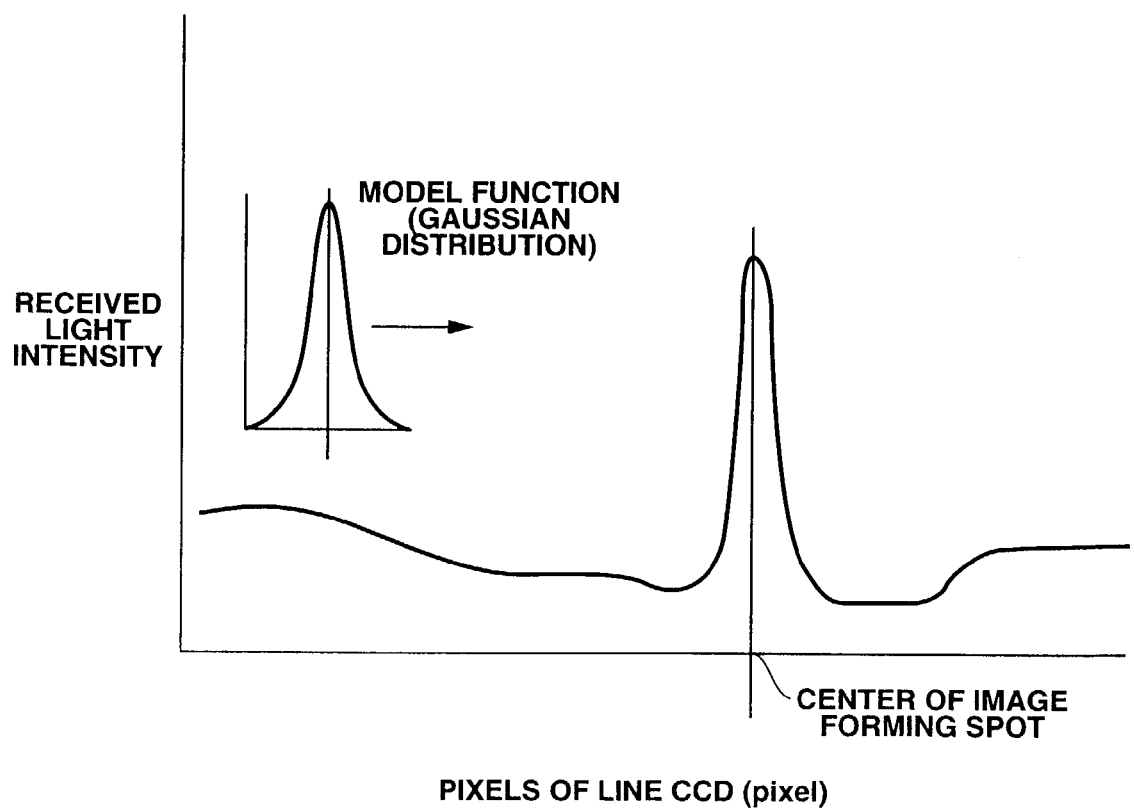
FIG. 9 is a diagram showing a distribution of light intensity of an image which is formed on a line CCD.

It is desirable to calculate the distance to the measured surface by providing a function to convert from the position of the imaging spot on the line CCD sensor 7 to the measured distance and substituting a value of pixels in the imaging spot on the line CCD into it. The line CCD 7 is disposed to incline toward the optical axis of the lens 5 because the image in the measurement spot 31, which is variable depending on the distance to the measured surface, is formed with a focus kept achieved on the line CCD without depending on the distance to the measured surface. And, the image formed on the line CCD has a light intensity in Gaussian distribution as shown in FIG. 9. For example, the center position (pixels) can be determined accurately by matching according to a normalizing correlation function with a Gaussian function determined as a model function. And, a value of the center position (pixels) of the imaging spot determined by the above processing is substituted in a conversion function for the measured distance expressed by a quarter for example, so to determine an actually measured distance.

The scanning mirror 24 or the measurement unit 8 itself is turned or moved to move the measurement spot 31 to an appropriate position so to measure Dw and Ds there, and the melt surface-heat shield gap 21 is calculated by the equation (1). Such a series of processing is controlled and performed by the measuring instrument controller 29, and the measured result is given to a host pulling control panel 30. In order to have an appropriate amount of light, which is received by the line CCD 7, in accordance with the reflectance of the measured surface, the measuring instrument controller 29 controls the intensity of the laser beam or the light-receiving sensibility of the line CCD 7 but handles it as an error if no image having an effective intensity is formed on the line CCD within a predetermined time period and notifies the operator or the host control panel 30 that effective measurement was not made. It is desirable that the measuring instrument controller 29 calculates a change in optical path length (geometrical distance) to the measured object resulting from the turning or movement of the scanning mirror 24 or the range-finding unit 8 itself and compensates the measured distance value.

Figure 10A:
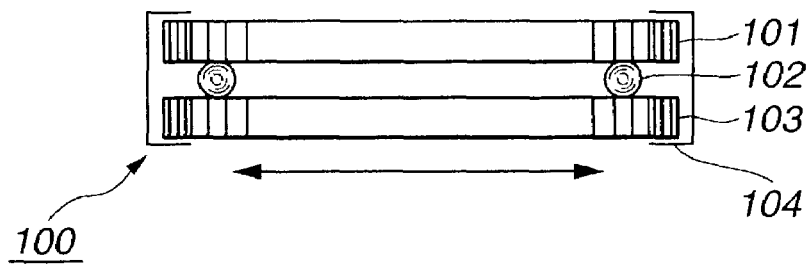
FIG. 10(A) to FIG. 10(C) are diagrams showing a specific structure of a preferable reflector in conducting the present invention.
Figure 10B:
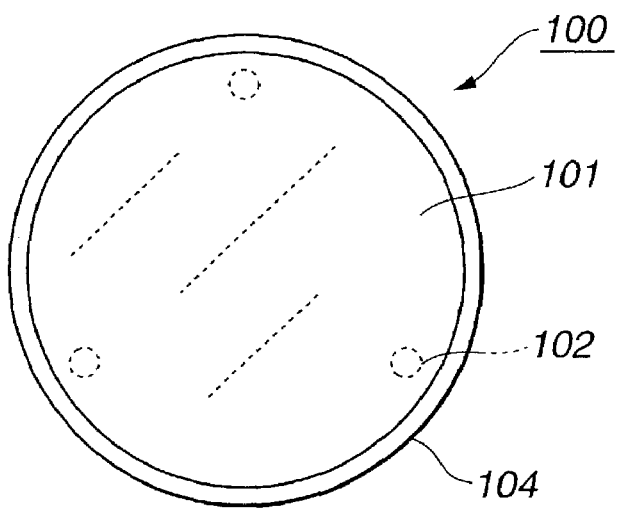
Figure 10C:
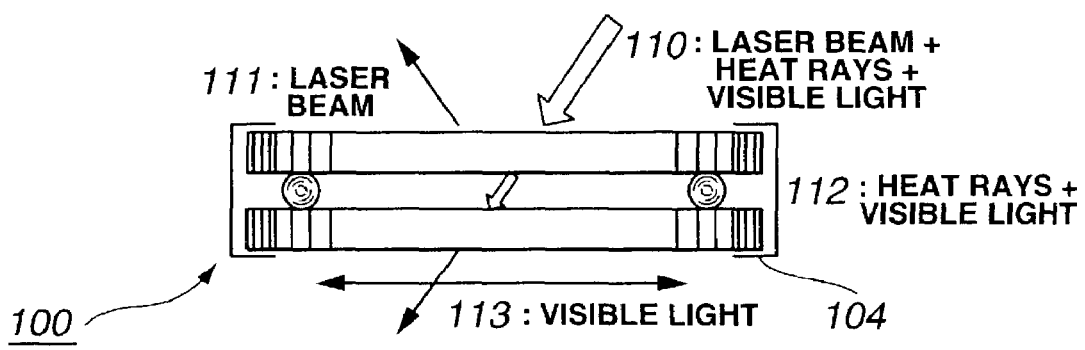

FIG. 10(A) to FIG. 10(C) are diagrams showing a specific structure of a preferable reflector 100 for conducting the invention. As shown in FIG. 10(A) and FIG. 10(B), the reflector 100 has a first mirror plate 101 and a second mirror plate 103 as a pair, between which balls 102 are held. And, a frame 104 is fitted to the peripheries of the pair of mirror plates 101 and 103. The reflector 100 configured as described above can have the first mirror plate 101 and the second mirror plate 103 slidable in a horizontal direction each other, though it is a small distance.

Therefore, even if thermal expansion is caused by the light from the melt surface to the reflector 100 having the above configuration, the first mirror plate 101 and the second mirror plate 103 are free to expand in the horizontal direction by a level corresponding to the thermal expansion, so that it is not necessary to worry about a warp or distortion involved in the temperature rise.

In addition, the first mirror plate 101 of this embodiment reflects the laser beam only but allows heat rays and visible light to pass through it. Meanwhile, the second mirror plate 103 reflects or absorbs heat rays but allows visible light to partly pass through it. Therefore, when a mixture light beam 110 of "laser beam+heat rays+visible light" as light emitted from the melt surface is entered as shown in FIG. 10(C), a laser beam 111 only is reflected by the first mirror plate 101 and guided to the range-finding unit 8. A mixture light beam 112 of "heat rays+visible light" having passed through the first mirror plate 101 hits the second mirror plate 103, where the heat rays are reflected or absorbed, while the visible light is partly passed through it.

Therefore, the pull-up operator can use the reflector 100 to observe the interior of the CZ furnace from the back (second mirror plate 103 side) of the reflector 100 while monitoring whether the melt level or the melt surface-heat shield gap has any change.

For example, the reflector 100 can be used as the scanning mirror 24 in the above-described embodiment. And, the reflector 100 is not limited to the one of the present invention and can be used for the level measuring apparatus in general using the measuring method based on the principle of triangulation. By using the reflector 100, the functions as the level measuring apparatus can be added to the existing CZ type puller quite easily.

Figure 11A:
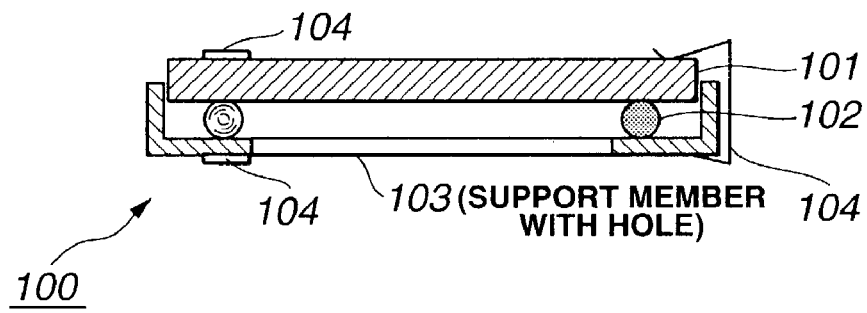
FIG. 11(A) to FIG. 11(C) are diagrams showing a specific structure of the reflector according to an embodiment different from the reflector of FIG. 11(A) to FIG. 11(C).
Figure 11B:
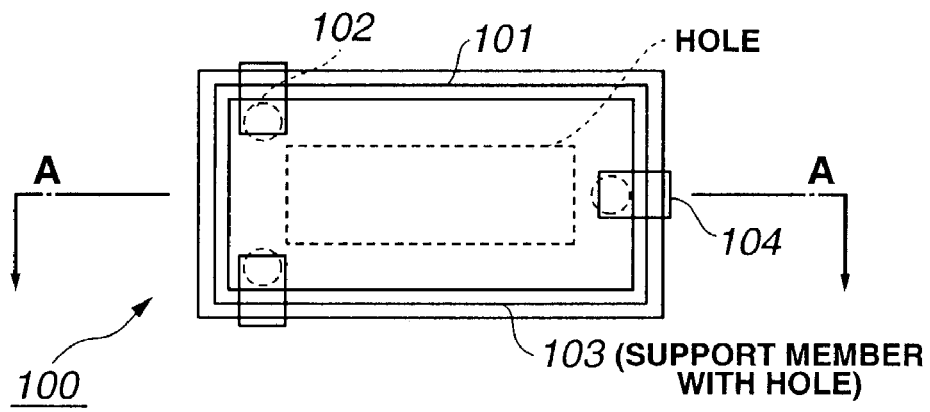
Figure 11C:
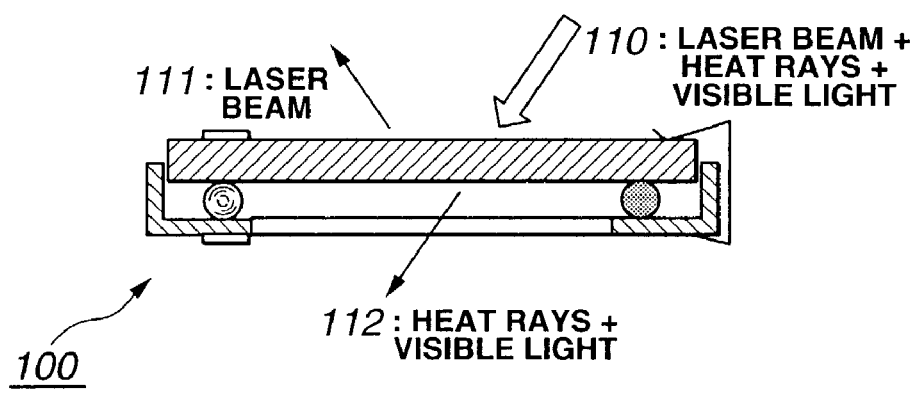

FIGS. 11(A) to 11(C) show an embodiment in that the reflector 100 is square. Like reference numerals are allotted to like components as those of the reflector 100 of FIGS. 10(A) to 10(C), but it is apparent from FIGS. 11(A) to 11(C) that the reflector 100 as the whole and the mirror may have any shape when the mirror plate (first mirror plate 101), which reflects the laser beam and allows the heat rays to pass through, and a heat rays absorbing plate or a heat rays absorbing/reflecting plate (second mirror plate 103), which is disposed on the back of the mirror, are paired in the mutually slidable state.

As described above, even when the gap between the heat shield and the single crystal is very small or the irregularity on the melt surface is lost by the application of a magnetic field, the laser beam emitted to the melt surface can be guided to the photodetector accurately according to the present invention, and the melt level and the melt surface-heat shield gap can be measured more accurately than before.

What is claimed is:

1. In a CZ type single crystal puller provided with a melt level measuring apparatus having a laser source for projecting a laser beam onto a melt surface and a photodetector for receiving the laser beam reflected from the melt surface that are placed in prescribed positions of a CZ furnace, which measures a melt level of the melt surface in the CZ furnace based on the principle of triangulation, a method for improving a probability of receiving a laser beam in the photodetector by reflecting the laser beam reflected from the melt surface on the bottom of a heat shield and guiding the laser beam to the photodetector through a prescribed route.

2. In a melt level measuring apparatus provided with a laser source and photodetector in prescribed positions of a CZ furnace, which projects the laser beam emitted from the laser source onto a melt surface, receives the laser beam reflected from the projected spot by the photodetector, and measures a melt level of the melt surface in the CZ furnace based on the principle of triangulation, a method of projecting the laser beam reflected from the melt surface onto the bottom of a heat shield and receiving the beam reflected from the bottom through the melt surface, thereby providing a more appropriate melt level measuring apparatus or switching to a melt surface-heat shield gap measuring apparatus.

3. A melt level measuring method comprising:
   measuring a first distance based on the principle of triangulation by projecting a laser beam emitted from a laser source onto a melt surface in a CZ furnace or a predetermined member in the CZ furnace, and by receiving a laser beam reflected at the melt surface or at the predetermined member with a photodetector,
   measuring a second distance based on the principle of triangulation by projecting the laser beam emitted from the laser source onto the melt surface, and receiving a laser beam which has been repeatedly reflected between the melt surface and the member in the CZ furnace with the photodetector; and
   measuring at least one of level of the melt surface, height of the member in the CZ furnace, and distance between the melt surface and the member by using the first and the second distances.

4. The melt level measuring method according to claim 3, wherein the projection of the laser beam onto the melt surface is scanned in a radial direction of a crucible in the CZ furnace, to find out a projecting position, the laser beam projected to the projecting position being guided into the photodetector; and a level of the melt is detected by projecting the laser beam to the projecting position.

5. The melt level measuring method according to claim 3, wherein at least one of a step of guiding the laser beam to the melt surface by changing a path of the laser beam emitted from the laser source, and a step of guiding the laser beam to the photodetector by changing the path of the laser beam reflected at the melt surface or at the predetermined member, is performed.

6. The melt level measuring method according to claim 3, wherein the predetermined member in the furnace is a heat shielding member installed in the CZ furnace.

* * * * *